United States Patent
Fink

(10) Patent No.: US 9,753,090 B2
(45) Date of Patent: Sep. 5, 2017

(54) METHOD FOR DETERMINING THE INTERNAL OHMIC RESISTANCE OF A BATTERY MODULE, BATTERY MANAGEMENT SYSTEM AND MOTOR VEHICLE

(71) Applicants: Robert Bosch GmbH, Stuttgart (DE); Samsung SDI Co., Ltd., Yongin-si, Gyeonggi-do (KR)

(72) Inventor: Holger Fink, Stuttgart (DE)

(73) Assignees: Robert Bosch GmbH, Stuttgart (DE); Samsung SDI Co., Ltd., Yongin-si, Gyeonggi-do (KR)

(*) Notice: Subject to any disclaimer, the term of this patent is extended or adjusted under 35 U.S.C. 154(b) by 139 days.

(21) Appl. No.: 14/405,876

(22) PCT Filed: May 24, 2013

(86) PCT No.: PCT/EP2013/060760
§ 371 (c)(1),
(2) Date: Dec. 5, 2014

(87) PCT Pub. No.: WO2013/182440
PCT Pub. Date: Dec. 12, 2013

(65) Prior Publication Data
US 2015/0153415 A1 Jun. 4, 2015

(30) Foreign Application Priority Data
Jun. 8, 2012 (DE) .................. 10 2012 209 649

(51) Int. Cl.
*G01R 31/36* (2006.01)
*B60L 11/18* (2006.01)

(52) U.S. Cl.
CPC ........ *G01R 31/362* (2013.01); *B60L 11/1857* (2013.01); *B60L 11/1861* (2013.01);
(Continued)

(58) Field of Classification Search
CPC ............ G01R 31/3658; G01R 31/3662; H02J 7/0003; H02J 7/0004; H02J 7/0054;
(Continued)

(56) References Cited

U.S. PATENT DOCUMENTS

| 4,044,300 A | 8/1977 | Dupuis et al. |
| 2008/0054909 A1* | 3/2008 | Fukuda ............ G01R 31/3662 324/429 |

(Continued)

FOREIGN PATENT DOCUMENTS

| CN | 2836029 Y | 11/2006 |
| WO | 00/42690 A1 | 7/2000 |

OTHER PUBLICATIONS

International Search Report corresponding to PCT Application No. PCT/EP2013/060760, mailed Mar. 19, 2014 (German and English language document) (5 pages).

*Primary Examiner* — Drew A Dunn
*Assistant Examiner* — Sailesh Thapa
(74) *Attorney, Agent, or Firm* — Maginot, Moore & Beck LLP

(57) ABSTRACT

A method for determining an internal ohmic resistance of a first battery module includes measuring a first voltage intensity of the first battery module. The first battery module is connected to at least a second battery module. The at least second battery module is under a load current. A second voltage intensity of the first battery module is measured. The first battery module is disconnected from the at least second battery module to enable the measurement of the first voltage intensity and the connection of the first battery module.

14 Claims, 2 Drawing Sheets

(52) U.S. Cl.
CPC .... *G01R 31/3662* (2013.01); *B60L 2240/545* (2013.01); *B60L 2240/547* (2013.01); *B60L 2240/549* (2013.01); *G01R 31/3658* (2013.01); *Y02T 10/705* (2013.01); *Y02T 10/7044* (2013.01)

(58) Field of Classification Search
CPC .. H02J 7/0008; H02J 2007/005; H02J 7/0031; H02J 7/008; H02J 7/0086; H02J 7/04; H02J 7/045; H02J 7/007; B60L 11/1864; B60L 11/1861; B60L 11/1803; Y02T 10/7011; Y02T 10/7005; Y02T 10/7061; Y02T 10/7044; H01M 2220/20; H01M 10/4207; H01M 2010/4271
USPC ............................. 701/22; 702/63; 324/430
See application file for complete search history.

(56) References Cited

U.S. PATENT DOCUMENTS

| | | |
|---|---|---|
| 2011/0234166 A1 | 9/2011 | Liu |
| 2011/0234231 A1 | 9/2011 | Liu et al. |
| 2013/0207663 A1* | 8/2013 | Wiesner ............. G01R 31/3658 324/426 |

* cited by examiner

METHOD FOR DETERMINING THE INTERNAL OHMIC RESISTANCE OF A BATTERY MODULE, BATTERY MANAGEMENT SYSTEM AND MOTOR VEHICLE

This application is a 35 U.S.C. §371 National Stage Application of PCT/EP2013/060760, filed on May 24, 2013, which claims the benefit of priority to Serial No. DE 10 2012 209 649.3, filed on Jun. 8, 2012 in Germany, the disclosures of which are incorporated herein by reference in their entirety.

The present disclosure relates to a method for determining an internal ohmic resistance of a battery module comprising at least one battery cell, for example a lithium-ion battery cell, as is used, for example, in traction batteries of electric or hybrid motor vehicles, i.e. in motor vehicles with at least partially or temporarily electrically operated drives. The disclosure therefore also relates to a motor vehicle and to a battery management system.

BACKGROUND

By virtue of improved storage capacity, more frequent rechargebility and higher energy densities, batteries can be used in ever broader applications. Batteries having a relatively low energy storage capacity are used, for example, for small portable electronic appliances such as mobile telephones, laptops, camcorders or the like, while batteries with a high capacity are used as energy source for the drive of motors of hybrid or electric vehicles, etc. or as stationary batteries.

Batteries can be formed, for example, by connecting battery modules to one another in series, wherein sometimes the battery modules are also connected to one another in parallel and the battery modules for their part can comprise battery cells which are connected in series and/or in parallel.

For driving motors of hybrid or electric vehicles, in particular battery module strings are suitable, which are also referred to as battery converters (BDCs). Battery module strings comprise at least two battery modules which are connected in series, wherein further battery modules can be connected in parallel. In this case, the battery modules have a coupling unit and are individually connectable and disconnectable with the aid of said coupling unit. Therefore, the battery module string can be used, by virtue of corresponding connection and disconnection of the modules, to generate an oscillating voltage characteristic. With a corresponding configuration, a voltage profile with an approximately sinusoidal characteristic which can be used for driving electric or hybrid motors can be generated, for example.

Battery management systems are used for battery management, for example for basic actuation of modules, for increasing the safety of batteries, for increasing efficiency and for extending the life of battery modules and battery systems comprising battery modules. One task of battery management systems consists in the determination of the present state of the battery modules. The important information for this purpose includes the impedance, the internal ohmic resistance of the battery module or of the battery cells contained in the battery module, wherein the impedance is dependent on the state of charge, the temperature and the degree of aging of the battery cells.

In accordance with the prior art, associated measurements are performed outside normal operation of the battery. For example, ISO 12405 proposes applying pulse-shaped charging and discharging currents to batteries to be tested in a test environment for time periods in the seconds range and measuring the voltage across the battery prior to and after the current pulse. The impedance then results as a ratio of the difference of the measured voltages to the intensity of the current pulse.

Since the current pulses are present for one or more seconds, the two voltage measurements are also apart from one another by this time period.

SUMMARY

In accordance with the disclosure, a method as claimed in claim 1 for determining an internal ohmic resistance of a battery module from measurements of voltage intensities is provided. The battery module is in this case part of a battery module string comprising at least one further battery module.

The method is characterized by repeated connection and disconnection of the battery module to and from the at least one further battery module, wherein the at least one further battery module is under a load current, and the method comprises the measurement of voltage intensities of the battery module prior to connection and after disconnection.

This enables an impedance spectroscopy at a battery module of a battery module string during running operation.

In one embodiment, substantially simultaneously with the connection of the battery module, disconnection of another battery module takes place, wherein the other battery module is selected in such a way that at least one of an output voltage of the battery module string, a charging or discharging current intensity of the battery module string and a temperature of the battery module string is uninfluenced by the substantially simultaneous switching.

Such a simultaneous connection and disconnection has particularly little influence on the running operation.

In another embodiment, the repeated connection and disconnection takes place with a predetermined time period between successive connections and a varying time period between a connection and a subsequent disconnection.

In yet another embodiment, the repeated connection and disconnection takes place with a varying time period between successive connections and a predetermined time period between a connection and a subsequent disconnection.

In yet a further other embodiment, the repeated connection and disconnection takes place with a first varying time period between successive connections and a second varying time period between a connection and a subsequent disconnection, wherein the ratio of the first to the second varying time periods is predetermined.

In accordance with the disclosure, a battery management system for a battery module string comprising at least two connectable and disconnectable battery modules as claimed in claim 6 is furthermore proposed, wherein the battery module string comprises an apparatus for measuring battery module voltage intensities and furthermore comprises an apparatus for transmitting measured module voltage intensities to the battery management system.

The battery management system is configured to determine changes in the transmitted battery module voltage intensities of one of the at least two battery modules as a result of repeated connection and disconnection of one of the at least two battery modules to and from at least one other of the at least two battery modules which is under a load current and to use these changes to determine an impedance of one of the at least two battery modules, wherein changes in measurements of voltage intensities of the battery module are determined prior to the connection and after the disconnection.

In one embodiment, the battery management system is configured to actuate coupling units of the battery modules of the battery module string and to further-process the determined changes in such a way that an internal ohmic resistance of one battery module is determined according to one of the other embodiments of the method.

Furthermore, a battery module string comprising the proposed battery management system is proposed in accordance with the disclosure. Finally, a motor vehicle with the proposed battery module string is also claimed.

Advantageous developments of the disclosure are described in the description.

BRIEF DESCRIPTION OF THE DRAWINGS

Exemplary embodiments of the disclosure will be explained in more detail with reference to the drawings and the description below. In the drawings.

DETAILED DESCRIPTION

The present disclosure has been made in the context of the development of a BDC-based, i.e. battery module string-based, battery system for an electric or hybrid motor vehicle and will be described below using this exemplary embodiment. However, the disclosure is not restricted to this exemplary embodiment, but can advantageously be used in all battery module strings comprising a plurality of battery modules which enable connection and disconnection under load. In particular, the intended use of the battery system is immaterial for the disclosure.

Figure 1:
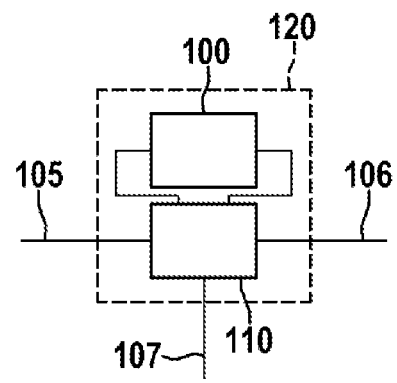
FIG. 1 shows an exemplary battery module for which the disclosure can be used.

FIG. 1 shows an exemplary battery module 100 comprising a coupling unit 110. The coupling unit 110 is either an integral part of the battery module 100 or, as shown in FIG. 1, is part of a system 120 comprising the battery module 100. The coupling unit 110 makes it possible to switch the battery module 100 on and off, i.e. to isolate it at least from one of the poles 105 and 106, also referred to as terminals, of the system 120. The coupling unit 110 of the example illustrated is actuable via a signal input 107 for this purpose. However, it is also possible for the coupling unit 110 to connect and disconnect the module at a predetermined frequency without any external driving. As a result, a square-wave voltage can be generated.

Figure 2:
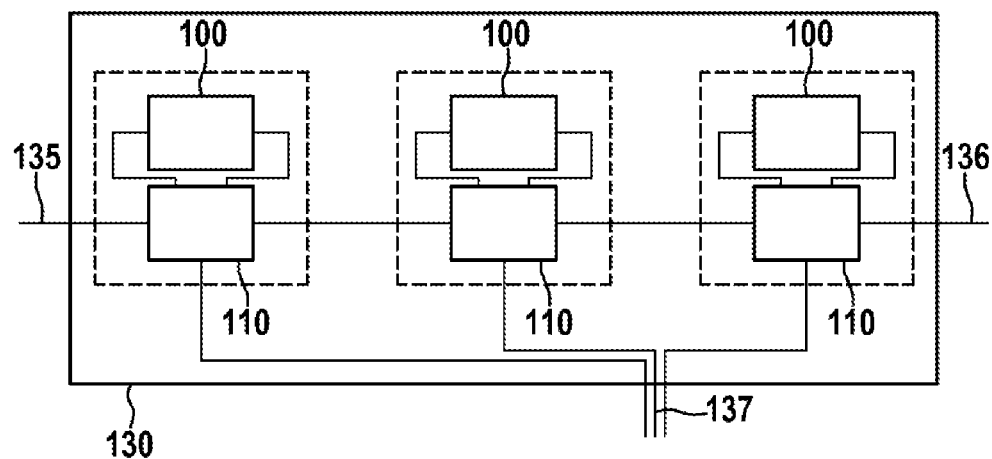
FIG. 2 shows an exemplary battery module string for which the disclosure can be used.

If a plurality of such modules 100 or systems 120 are now arranged in series in a battery module string 130, as shown in FIG. 2, and are connected and disconnected repeatedly with a time shift, an approximately sinusoidal voltage characteristic of a voltage between the terminals 135 and 136 of the battery module string 130 can be generated. Under load, a current characteristic corresponding to the voltage characteristic results.

In an exemplary embodiment (not shown), all of the modules combined in a string are connected and disconnected via a single common coupling unit. This can be configured so as to generate a sinusoidal or substantially rectangular voltage characteristic with a predetermined frequency. Alternatively, voltage characteristics with a variable frequency can be generated if there is the possibility of driving by means of the common coupling unit for varying the frequency.

Under load, each (even short-term) connection and redisconnection generates a current surge or pulse in the connected battery module 100 since the current already flowing through the string 130 prior to the connection also flows through the connected module 100 during the connection.

As a result of this current surge or pulse, the module voltage of battery cells combined in the module 100 changes, and therefore the voltage of the module 100 changes as well. The time frame within which this change takes place is in this case determined by a duration of the connection and is markedly below one second. Therefore, relatively precise measurement of a voltage change becomes possible.

In particular, it is possible to connect and disconnect the module to be tested repeatedly and thus to generate a measurement curve with a plurality of measurement points.

In this case, the repeated connection and disconnection can take place in accordance with a first pattern with a fixed connection duration and varying disconnection duration. In this case, the connection duration is the time between a connection and the directly following disconnection, and the disconnection duration is the time between a disconnection and the directly following connection. Then, the frequency of identical current pulses is varied.

Alternatively, the repeated connection and disconnection takes place in accordance with a second pattern with a varying connection duration and a fixed disconnection duration. In this case, the current pulses generated at the same frequency are varied in terms of their width.

It is also possible to vary both the connection duration and the disconnection duration, but in the process to keep the ratio of connection duration to disconnection duration constant. This produces a third pattern.

With the aid of the measurement of the voltage change at the module 100 as a result of the connection and redisconnection and the current intensity of the current flowing through the module during the connection, therefore, the impedance of the connected module can be determined from the ratio of the voltage change to the current intensity under different measurement conditions.

This determination is therefore possible during running operation, under load. If the measured impedance changes during operation, this is an indication of an aging process of the module in question. It is furthermore possible to store setpoint impedance curves relating to the connection patterns in a memory unit of a battery management system. Then, a discrepancy between an impedance curve determined from measurements in the case of a given connection pattern and the setpoint impedance curve stored in the memory unit in relation to the given connection pattern can be an indication of a change of battery cells in the module.

In this case, it is also possible to configure the connection such that the voltage present between poles of the battery string does not change, i.e. the connection is voltage-invariant. For example, in the case of a series or parallel connection of a module to be tested, a previously correspondingly connected other module can be disconnected. If the module to be tested is then disconnected again, the other module is connected again.

It is also possible to configure the connection to be current-invariant. In this case, the load current flowing through the battery string is kept constant. Finally, it is also of interest for impedance measurements to configure the connection to be temperature-invariant since the internal ohmic resistance of a battery module changes with temperature.

Therefore, modules can be combined to form module pairs, also referred to as clusters, wherein one module per cluster can be tested, while the other module in the respective cluster is switched simultaneously, but in opposition, to the module to be tested.

Furthermore, if connections of modules 100 to the string 130 are performed under different phase angles of the current, i.e. with different current intensities, in each case an impedance profile can be determined for one, a plurality of or all of the modules in the string 130. If such an impedance profile changes during operation without the preset target power of a consumer device having been changed, this is an indication of an aging process of the module in question. It is furthermore possible to store corresponding setpoint impedance profiles in the memory unit. Again, a discrepancy between the measured impedance profile and the setpoint impedance profile can be an indication of module aging.

Figure 3:
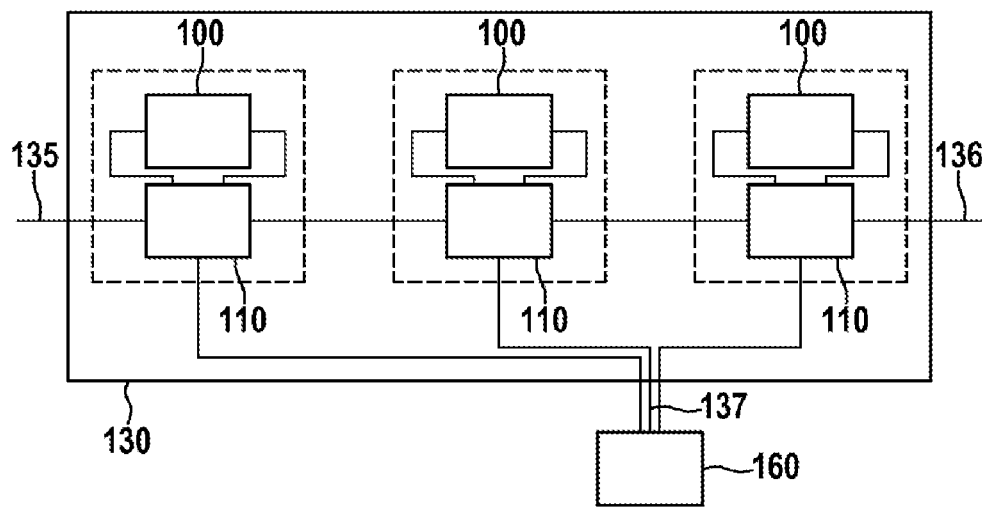
FIG. 3 shows an example of a system according to the disclosure comprising a battery module string and a battery management system.

FIG. 3 shows an exemplary battery management system 160 in interaction with the exemplary string 130 shown in FIG. 2. The battery management system 160 detects the voltage curves made available by the battery module strings 130 to the consumer device and the currents flowing and controls, via connections 137 to the string 130, the modules or systems arranged in the string 130.

The disclosure therefore enables quasi-continuous monitoring of the module states during running operation. This makes it possible to identify losses of efficiency or even defects of modules quickly and safely. This is advantageous because the modules identified as defective or aging can be replaced, and because faults in the power provided by the battery string owing to the defective or aging module can be at least partially compensated for by correspondingly changing the actuations of the coupling units.

The invention claimed is:

1. A method for determining an impedance of a first battery module of at least two battery modules in a battery module string, the method comprising:
   performing repeated connection and disconnection of the first battery module to and from a second battery module of the at least two battery modules in the battery module string while the battery module string is under a load current, each repeated connection and disconnection of the first battery module taking place with a predetermined time period between successive connections and a varying time period between a connection and a subsequent disconnection;
   measuring voltage intensities of the first battery module (i) prior to the connection of the first battery module to the second battery module and (ii) after the disconnection of the first battery module to the second battery module;
   determining changes in the measured voltage intensities; and
   determine an impedance the first battery module based on the changes.

2. The method as claimed in claim 1, further comprising:
   disconnecting a third battery module of the at least two battery modules in the battery module string simultaneously with the connection of the first battery module to the second battery module, the third battery module being selected such that at least one of (i) an output voltage of the battery module string, (ii) a charging or discharging current intensity of the battery module string, and (iii) a temperature of the battery module string is uninfluenced by the simultaneous disconnection of the third battery module and the connection of the first battery module.

3. A battery management system for a battery module string, the battery module string including (i) at least two battery modules, (ii) a first apparatus configured to measure battery module voltage intensities under load, and (iii) a second apparatus configured to transmit the measured battery module voltage intensities to the battery management system, the battery management system is configured to:
   receive battery module voltage intensities from the battery module string;
   determine changes in the received battery module voltage intensities of a first battery module of the at least two battery modules, the first battery module being repeatedly connected to and disconnected from a second battery module of the at least two battery modules while the battery module string is under a load current, the battery module voltage intensities of the first battery module being measured (i) prior to the connection of the first battery module to the second battery module and (ii) after the disconnection of the first battery module from the second battery module; and
   determine an impedance of one of the at least two battery modules based on the changes,
   wherein the battery module string is connected to the battery management system.

4. The battery management system as claimed in claim 3, the battery management system further configured to:
   actuate coupling units of the at least two battery modules of the battery module string to repeatedly connect and disconnect the first battery module to and from the second battery module; and
   actuate coupling units of the at least two battery modules of the battery module string to disconnect a third battery module of the at least two battery modules simultaneously with the connection of the first battery module to the second battery module, the third battery module being selected such that at least one of (i) an output voltage of the battery module string, (ii) a charging or discharging current intensity of the battery module string, and (iii) a temperature of the battery module string is uninfluenced by the simultaneous disconnection of the third battery module and the connection of the first battery module.

5. The battery management system as claimed in claim 3, wherein each repeated connection and disconnection of the first battery module takes place with a predetermined time period between successive connections and a varying time period between a connection and a subsequent disconnection.

6. The battery management system as claimed in claim 3, wherein each repeated connection and disconnection of the first battery module takes place with a varying time period between successive connections and a predetermined time period between a connection and a subsequent disconnection.

7. The battery management system as claimed in claim 3, wherein each repeated connection and disconnection takes place with a first varying time period between successive connections and a second varying time period between a connection and a subsequent disconnection and a ratio of the first varying time period to the second varying time period is predetermined.

8. A battery system comprising:
   a battery module string comprising:
      at least two battery modules;

a first apparatus configured to measure battery module voltage intensities under load; and a second apparatus configured to transmit the measured battery module voltage intensities; and a battery management system connected to the battery module string, the battery management system configured to:

receive battery module voltage intensities from the battery module string;

determine changes in the received battery module voltage intensities of a first battery module of the at least two battery modules, the first battery module being repeatedly connected to and disconnected from a second battery module of the at least two battery modules while the battery module string is under a load current, the battery module voltage intensities of the first battery module measured (i) prior to the connection of the first battery module to the second battery module and (ii) after the disconnection of the first battery module from the second battery module; and determine an impedance of one of the at least two battery modules based on the changes.

9. The battery module string of claim 8, wherein the battery module string is comprised by a motor vehicle.

10. The battery system as claimed in claim 8, the battery management system is further configured to:

actuate coupling units of the at least two battery modules of the battery module string to repeatedly connect and disconnect the first battery module to and from the second battery module.

11. The battery system as claimed in claim 10, the battery management system is further configured to:

actuate coupling units of the at least two battery modules of the battery module string disconnect a third battery module of the at least two battery modules in the battery module string simultaneously with the connection of the first battery module to the second battery module, the third battery module being selected such that at least one of (i) an output voltage of the battery module string, (ii) a charging or discharging current intensity of the battery module string, and (iii) a temperature of the battery module string is uninfluenced by the simultaneous disconnection of the third battery module and the connection of the first battery module.

12. The battery system as claimed in claim 8, wherein each repeated connection and disconnection of the first battery module takes place with a predetermined time period between successive connections and a varying time period between a connection and a subsequent disconnection.

13. The battery system as claimed in claim 8, wherein each repeated connection and disconnection of the first battery module takes place with a varying time period between successive connections and a predetermined time period between a connection and a subsequent disconnection.

14. The battery system as claimed in claim 8, wherein each repeated connection and disconnection takes place with a first varying time period between successive connections and a second varying time period between a connection and a subsequent disconnection and a ratio of the first varying time period to the second varying time period is predetermined.

* * * * *